US012736335B2

(12) United States Patent
Lai

(10) Patent No.: US 12,736,335 B2
(45) Date of Patent: Sep. 15, 2026

(54) TESTING SYSTEM AND METHOD THEREOF

(71) Applicant: NANYA TECHNOLOGY CORPORATION, New Taipei City (TW)

(72) Inventor: Cheng-Sung Lai, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 164 days.

(21) Appl. No.: 18/793,954

(22) Filed: Aug. 5, 2024

(65) Prior Publication Data

US 2026/0036422 A1 Feb. 5, 2026

(51) Int. Cl.
*G01B 11/30* (2006.01)
*G01R 31/28* (2006.01)

(52) U.S. Cl.
CPC ........ *G01B 11/306* (2013.01); *G01R 31/2893* (2013.01)

(58) Field of Classification Search
None
See application file for complete search history.

(56) References Cited

U.S. PATENT DOCUMENTS

2010/0156434 A1* 6/2010 Okino ................. H10P 72/0458 324/555
2017/0350688 A1* 12/2017 Boyd, Jr. ........... G01B 9/02023
2019/0013224 A1* 1/2019 Chiba ................. H10P 72/0616
2022/0057323 A1* 2/2022 Egan ...................... G01N 21/41

FOREIGN PATENT DOCUMENTS

CN 111014067 A 4/2020
TW 202331889 A 8/2023

* cited by examiner

*Primary Examiner* — Jas A Sanghera
(74) *Attorney, Agent, or Firm* — CKC & Partners Co., LLC

(57) ABSTRACT

A testing system includes a board conveying device for holding a testing board, a board transfer chamber connecting with the board conveying device, and an IC test chamber connecting with the board transfer chamber. The board transfer chamber includes a first sensor configured to detect a flatness of the testing board.

16 Claims, 10 Drawing Sheets

TESTING SYSTEM AND METHOD THEREOF

BACKGROUND

Integrated circuits (ICs), as known as chips, are used in a wide range of electronic devices, including computers, smartphones, and televisions, to perform various functions. “Burn-in” is a process where semiconductor components are tested in order to detect any early failures due to defects in design, materials, process, or manufacturing. The burn-in boards (BIBs) are printed circuit boards designed to carry ICs when the ICs are tested in the burn-in process. Since testing boards can be easily inclined and/or collided during the process, the stability and efficiency of the transportation of testing boards is a critical issue in the field of IC industry.

Despite transporting inclined and/or collided testing boards can cause serious damages and inaccurate test results in the subsequent processes, in the past, only manpower visual inspection of the appearance of the testing boards has been done before they enter the production line. The problem with manpower visual inspection is that it avoids minor abnormalities from being caught, hence inevitably allows the occurrence of transporting abnormal testing boards. What is needed are methods and apparatus for auto-detecting the flatness of testing boards.

SUMMARY

The invention provides a testing system that includes a board conveying device for holding a testing board, a board transfer chamber connecting with the board conveying device, in which board transfer chamber includes a first sensor configured to detect a flatness of the testing board, and an IC test chamber connecting with the board transfer chamber.

In some embodiments, the board transfer chamber of the testing system may have a second sensor for detecting the flatness of the testing board.

In some embodiments, the first sensor is configured to detect a first level of one end of the testing board and the second sensor is configured to detect a second level of another end of the testing board.

In some embodiments, the first sensor may be configured to generate a radiation downward to the testing board.

In some embodiments, the first sensor may be an infrared sensor.

In some embodiments, the testing system may also have a processor configured to determine the flatness of the testing board by calculating the difference between the first level and the second level.

In some embodiments, the testing system may have a plurality of layers in the board conveying device, a storage platform configured to support the testing board in the board transfer chamber, and a lifting device configured to move the storage platform along the plurality of layers of the board conveying device.

In some embodiments, the board transfer chamber may have a wall along one side of the storage platform, and the first sensor is fixed on the wall.

In some embodiments, the IC test chamber may have a pick-and-place mechanism configured to place a testing device on the testing board.

In some embodiments, the board transfer chamber may have a robot arm configured to drag the testing board from the board conveying device to the board transfer chamber.

A method of a testing system may have operations of moving a testing board from a board conveying device to a board transfer chamber, moving the testing board from the board transfer chamber to an IC test chamber, determining whether a flatness of the testing board is acceptable during moving the testing board, and placing a testing device on the testing board when the flatness of the testing board is determined as acceptable.

In some embodiments, determining whether the flatness of the testing board is acceptable when moving the testing board includes operations of sensing a first level of one end of the testing board and sensing a second level of another end of the testing board during moving the testing board, calculating the difference between the first level and the second level, and determining whether the difference falls within a pre-determined specification.

In some embodiments, sensing the first level of the one end of the testing board and sensing the second level of the another end of the testing board include emitting radiations, from the first sensor and the second sensor, toward one end and another end of the testing board, respectively, and receiving, by the first sensor and the second sensor, the radiations reflected by the testing board.

In some embodiments, the radiations may be emitted downward toward the testing board.

In some embodiments, the radiations may be infrared radiations.

In some embodiments, the radiations may be emitted toward a first support frame and a second support frame of the testing board, respectively.

In some embodiments, the first and second support frames may include substantially flat surfaces.

In some embodiments, determining whether the flatness of the testing board is acceptable during moving the testing board include sensing a first level of one end of the testing board and sensing a second level of another end of the testing board during moving the testing board, calculating a first difference between the first level and a reference level and a second difference between the first level and the reference level, and determining whether the first and second differences both fall within a pre-determined specification.

In some embodiments, the method also includes halting moving the testing board when the flatness of the testing board is determined as unacceptable.

In some embodiments, the method also includes displaying an abnormality warning signal when the flatness of the testing board is determined as unacceptable.

These and other features, aspects, and advantages of the present invention will become better understood with reference to the following description and appended claims.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1A:
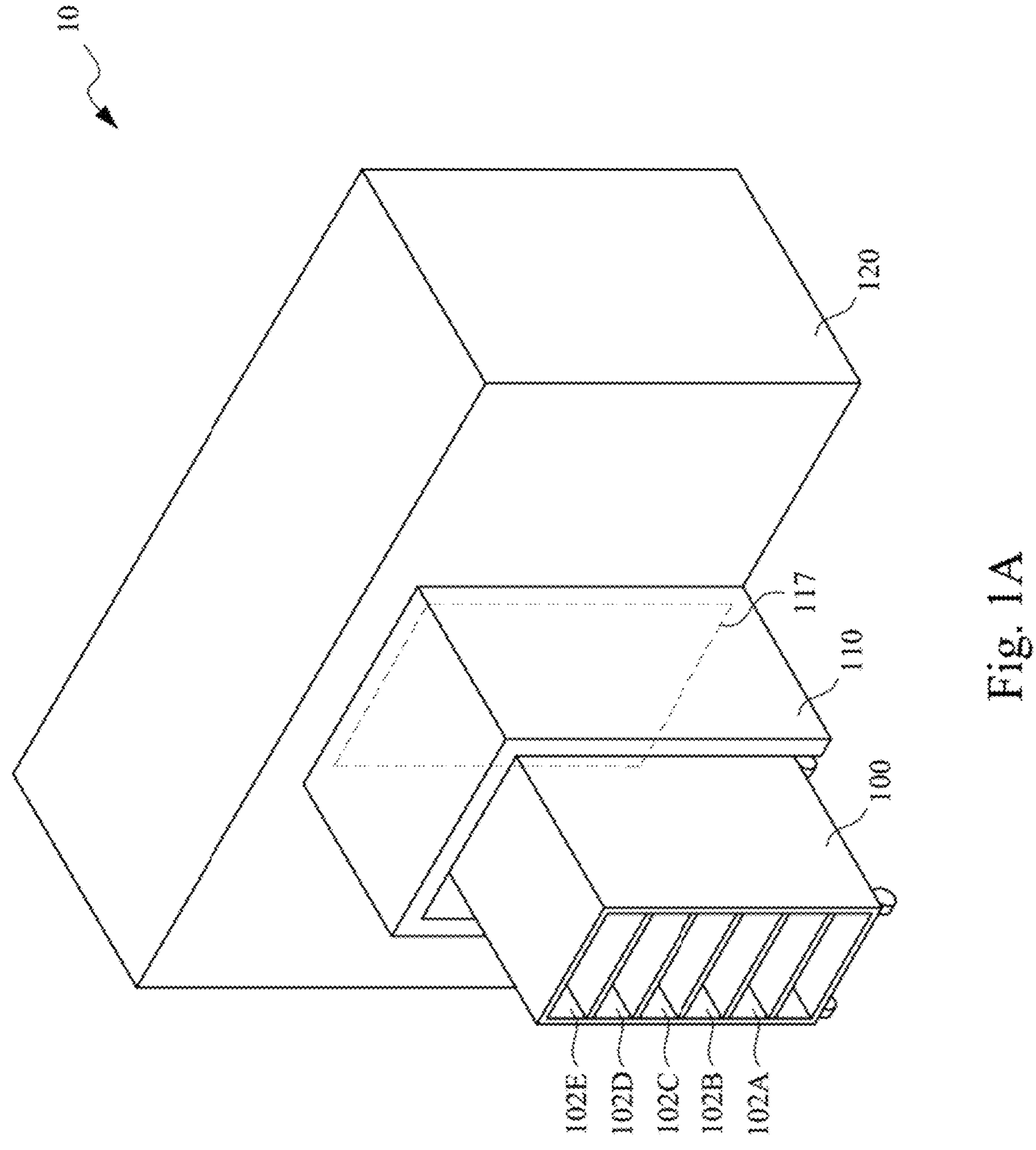
FIG. 1A is a schematic view of a testing system in accordance with some embodiments of the present disclosure.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. It is noted that, in accordance with the standard practice in the industry, various features are not drawn to scale. In fact, the dimensions of the various features may be arbitrarily increased or reduced for clarity of discussion.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

As used herein, "around," "about," "approximately," or "substantially" may generally mean within 20 percent, or within 10 percent, or within 5 percent of a given value or range. Numerical quantities given herein are approximate, meaning that the term "around," "about," "approximately," or "substantially" can be inferred if not expressly stated. One skilled in the art will realize, however, that the values or ranges recited throughout the description are merely examples, and may be reduced or varied with the down-scaling of the integrated circuits.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 1B:
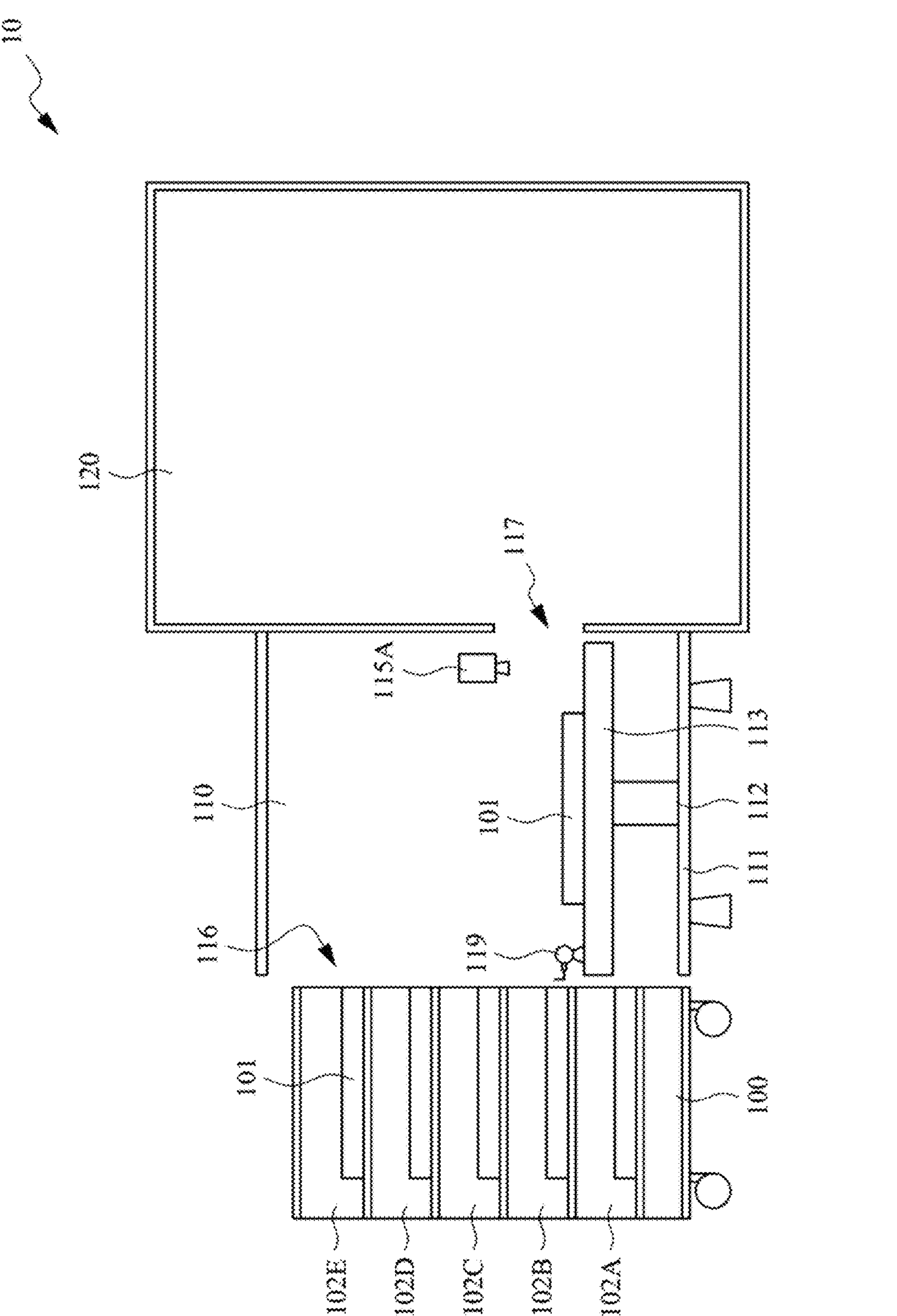
FIG. 1B is a schematic cross-sectional view of a testing system in accordance with some embodiments of the present disclosure.

FIG. 1A is a schematic view of a testing system in accordance with some embodiments of the present disclosure. FIG. 1B is a schematic cross-sectional view of a testing system in accordance with some embodiments of the present disclosure.

Referring to FIG. 1A and FIG. 1B, shown there is a testing system 10. The testing system 10 may include a board conveying device 100, a board transfer chamber 110, and an IC test chamber 120. The testing system 10 is configured to carry the testing boards 101 from the board conveying device 100 to the board transfer chamber 110, and to the IC test chamber 120. In some embodiments, the board transfer chamber 110 has an interface 116 for receiving the board conveying device 100, and an interface 117 connecting with the IC test chamber 120.

In some embodiments, the board conveying device 100 can be a trolley or other suitable conveying device with layer(s) of platforms to hold the testing boards 101. For example, in the depicted embodiments, the board conveying device 100 includes five layers 102A, 102B, 102C, 102D, and 102E of platforms for holding the testing boards 101, while more or less layers of platforms may also be applied in other embodiments. In some embodiments, the testing board 101 can be a burn-in board (BIB), or other suitable test boards.

Referring to FIG. 1B, the board transfer chamber 110 may include a base platform 111, a lifting device 112 disposed on the base platform 111, and a storage platform 113 supported by the lifting device 112. In some embodiments, the storage platform 113 is movable, through the lifting device 112, along the vertical direction to different vertical layers 102A, 102B, 102C, 102D, and 102E of the board conveying device 100. A robot arm 119 in the board transfer chamber 110 and near the storage platform 113 can grab a testing board 101 of a target layer onto the storage platform 113.

The board transfer chamber 110 may include at least one sensor, such as a first sensor 115A, located near the interface 117 between the board transfer chamber 110 and the IC test chamber 120. In some embodiments, the interface 117 can be a gate between the board transfer chamber 110 and the IC test chamber 120.

The IC test chamber 120 may be used to mount, load and unload, and test the incoming boards from board transfer chamber 110. In some embodiments, the IC test chamber 120 may include a pick-and-place mechanism (e.g., pick-and-place mechanism 210 in FIG. 4A) to mount ICs (e.g., ICs 205 in FIG. 4A) or other testing devices to a testing board 101.

Figure 1C:
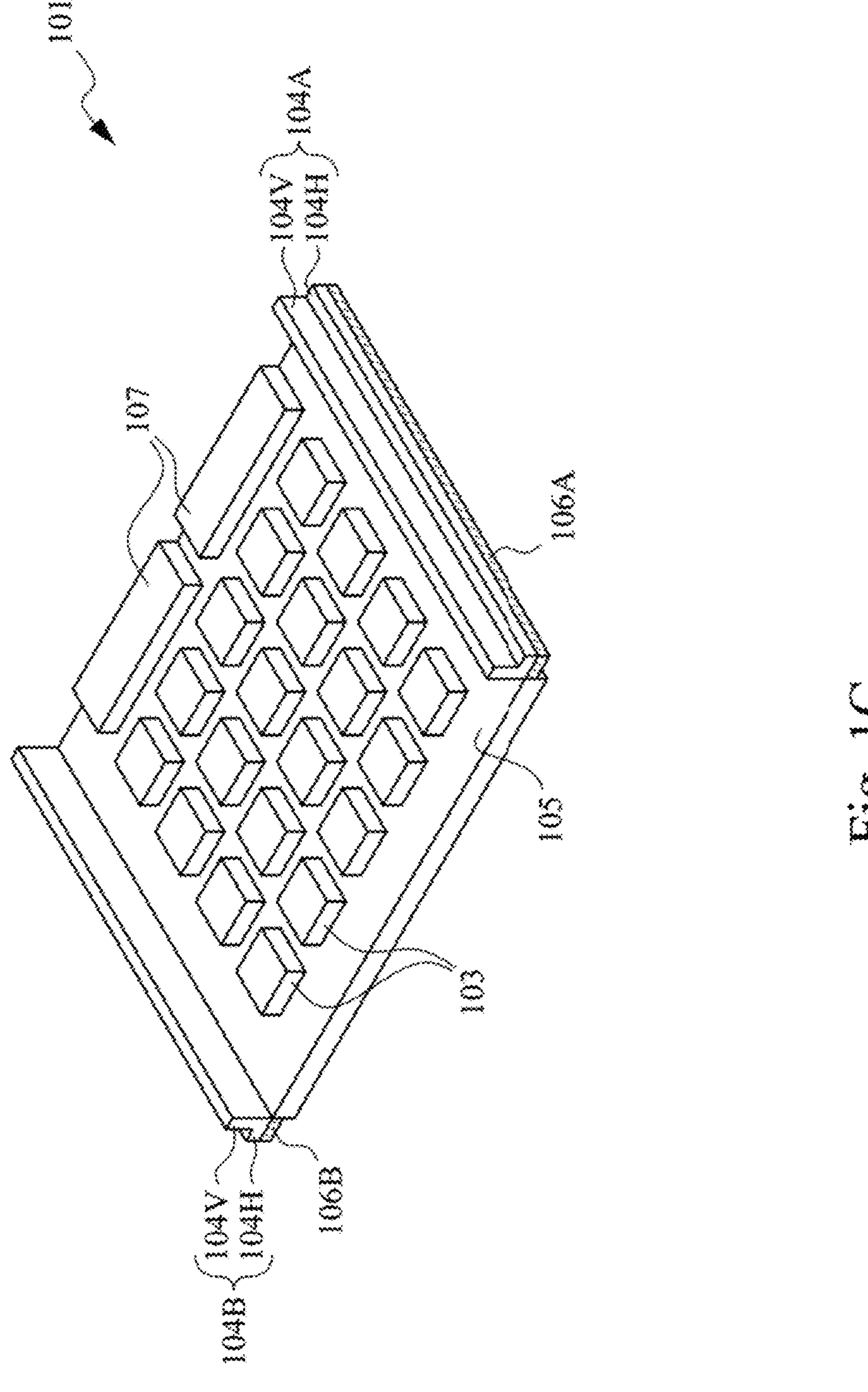
FIG. 1C is a schematic view of a testing board in accordance with some embodiments of the present disclosure.

FIG. 1C is a schematic view of a testing board in accordance with some embodiments of the present disclosure. Specifically, FIG. 1C illustrates a detailed structure of the testing board 101 as discussed above in FIGS. 1A and 1B.

The testing board 101 may include a main board 105, sockets 103 and connectors 107 on the main board 105, support frames 104A and 104B on opposite sides of the main board 105, and guiding members 106A and 106B below the respective support frames 104A and 104B.

In some embodiments, the main board 105 may be a printed wiring board. The sockets 103 are electrically coupled to the main board 105 and are configured to mount testing devices, such as ICs. The connectors 107 may be configured to couple test and/or power signals between the testing board 101 and testing devices (not shown).

In some embodiments, the support frames 104A and 104B may be L-shaped frames connecting the two sides of the main board 105. For example, each of the support frames 104A and 104B may include a vertical portion 104V and a horizontal portion 104H connecting with each other.

In some embodiments, the guiding members 106A and 106B are disposed below and are in contact with the horizontal portions 104H of the respective support frames 104A and 104B. The guiding members 106A and 106B are configured to facilitate the smooth movement of the testing board 101 along the storage platform 113 (see FIG. 1D). In some embodiments, the support frames 104A and 104B and the guiding members 106A and 106B are made of different materials. For example, the support frames 104A and 104B may be made of metal, such as steel, stainless steel, or other suitable materials. In some embodiments, the guiding members 106A and 106B may be made of wooden material or other suitable materials to reduce friction and create lubrication.

Figure 1D:
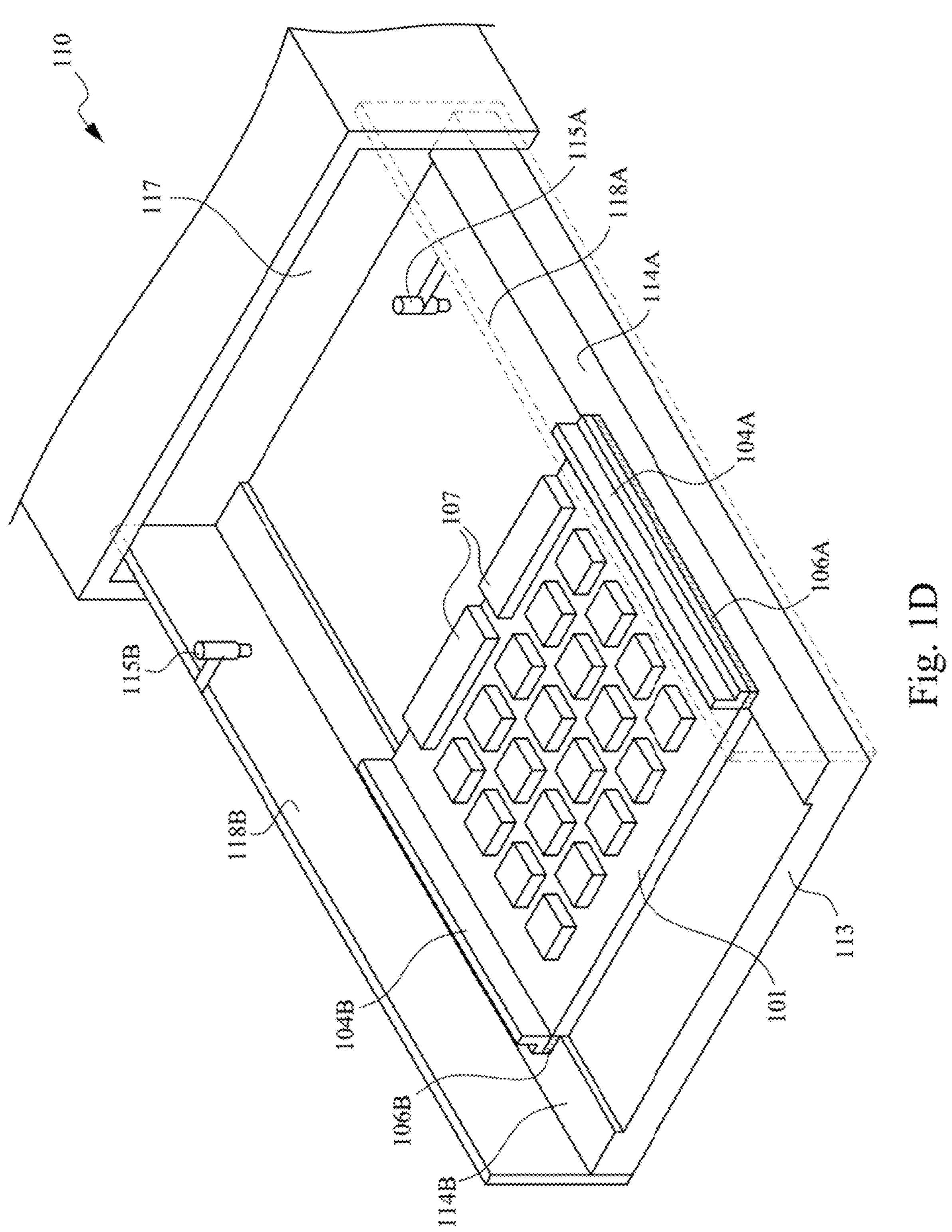
FIG. 1D is a schematic view where a testing board is loaded into a board transfer chamber in accordance with some embodiments of the present disclosure.

FIG. 1D is a schematic view where a testing board is loaded into a board transfer chamber in accordance with some embodiments of the present disclosure. Specifically, FIG. 1D illustrates a testing board 101 dragged onto the storage platform 113 in the board transfer chamber 110.

In some embodiments, the storage platform 113 may include guiding rails 114A and 114B on two ends of the storage platform 113 and protruding upward from the storage platform 113. For example, when a testing board 101 is dragged onto the storage platform 113, the guiding members 106A and 106B are placed on the guiding rails 114A and 114B, respectively, such that the guiding members 106A and 106B can be movable along the guiding rails 114A and 114B.

In some embodiments, the board transfer chamber 110 further includes two walls 118A and 118B built along the two end sides of the storage platform 113. In some embodiments, a first sensor 115A is attached to the wall 118A and a second sensor 115B is attached to the wall 118B. However, in other embodiments, the first sensor 115A and the second sensor 115B can be fixed at other suitable positions of the board transfer chamber 110.

The first and second sensors 115A and 115B are configured to detect the levels of opposite ends of the testing board 101. For example, when the testing board 101 is moved to a position below the first and second sensors 115A and 115B, the first and second sensors 115A and 115B may generate radiations toward opposite ends of the testing board 101 and receive the reflected radiations from the testing board 101, so as to detect the levels of opposite ends of the testing board 101.

In some embodiments, the first and second sensors 115A and 115B may generate radiations toward the support frames 104A and 104B of the testing board 101, respectively. More specifically, the radiations are generated toward the horizontal portions 104H of the support frames 104A and 104B, respectively. The horizontal portions 104H of the support frames 104A and 104B each may include a substantially flat top surface for reflecting the radiations back to the first and second sensors 115A and 115B, respectively. Accordingly, a first distance between the support frame 104A and the first sensor 115A and a second distance between the support frame 104B and the second sensor 115B can be detected. In some embodiments, the first distance and the second distance may represent a first level and a second level of the support frames 104A and 104B, respectively. By calculating the difference between the first and second distances (or between the first and second levels), the flatness of the testing board 101 can be therefore determined.

In some embodiments, the first and second sensors 115A and 115B are infrared sensors that emit and receive infrared radiation. In some embodiments, the first and second sensors 115A and 115B are configured to emit radiations downward. In some embodiments, the first and second sensors 115A and 115B are configured to emit radiations toward the horizontal portions 104H of the support frames 104A and 104B on the storage platform 113.

In some embodiments, the first and second sensors 115A and 115B are built near the interface 117 to monitor the latest flatness condition of the testing board 101, right before it enters the IC test chamber 120. That is, the first and second sensors 115A and 115B may be closer to the interface 117 than to the interface 116.

Figure 2:
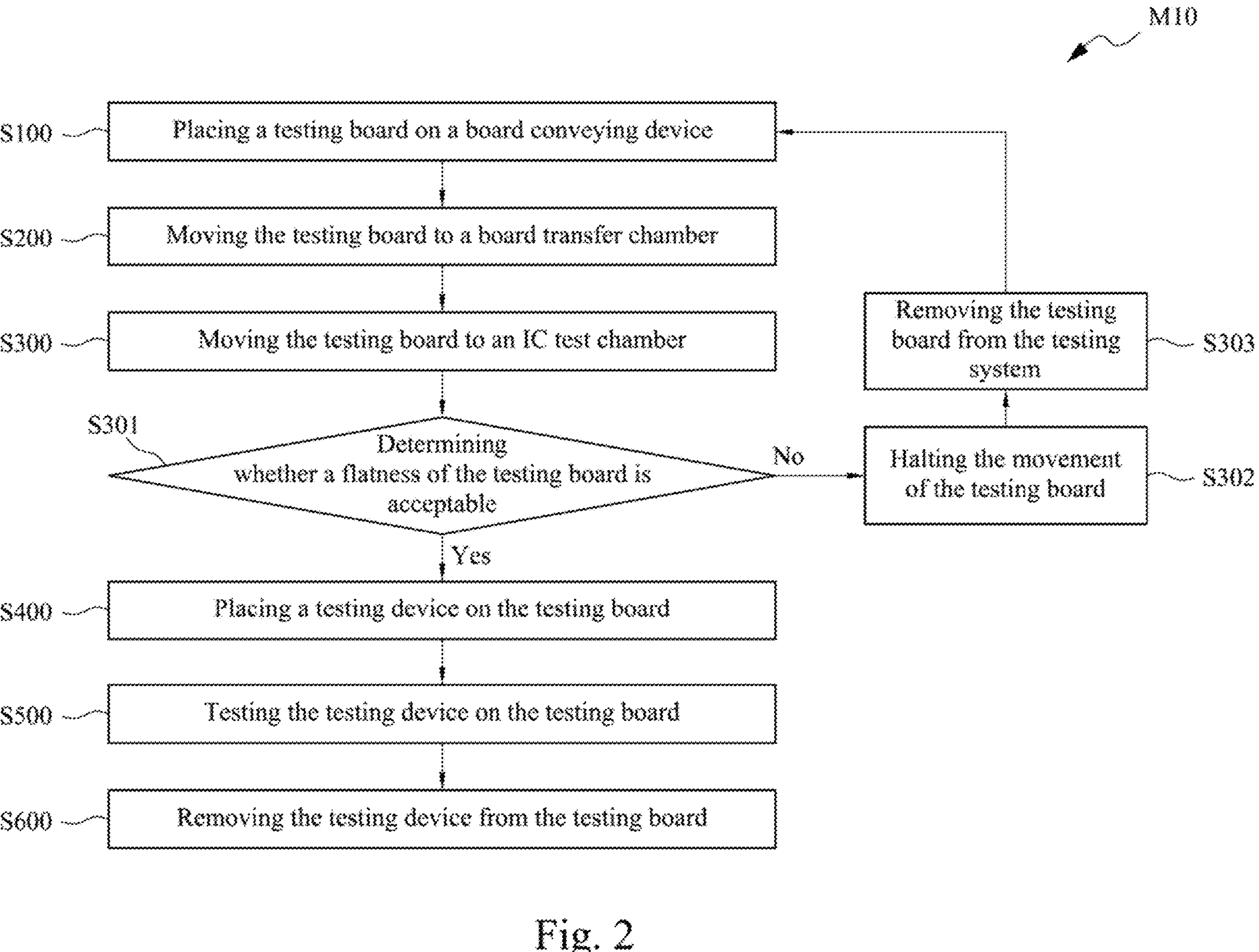
FIG. 2 is a flow chart of methods of testing ICs in accordance with some embodiments of the present disclosure.
Figure 3A:
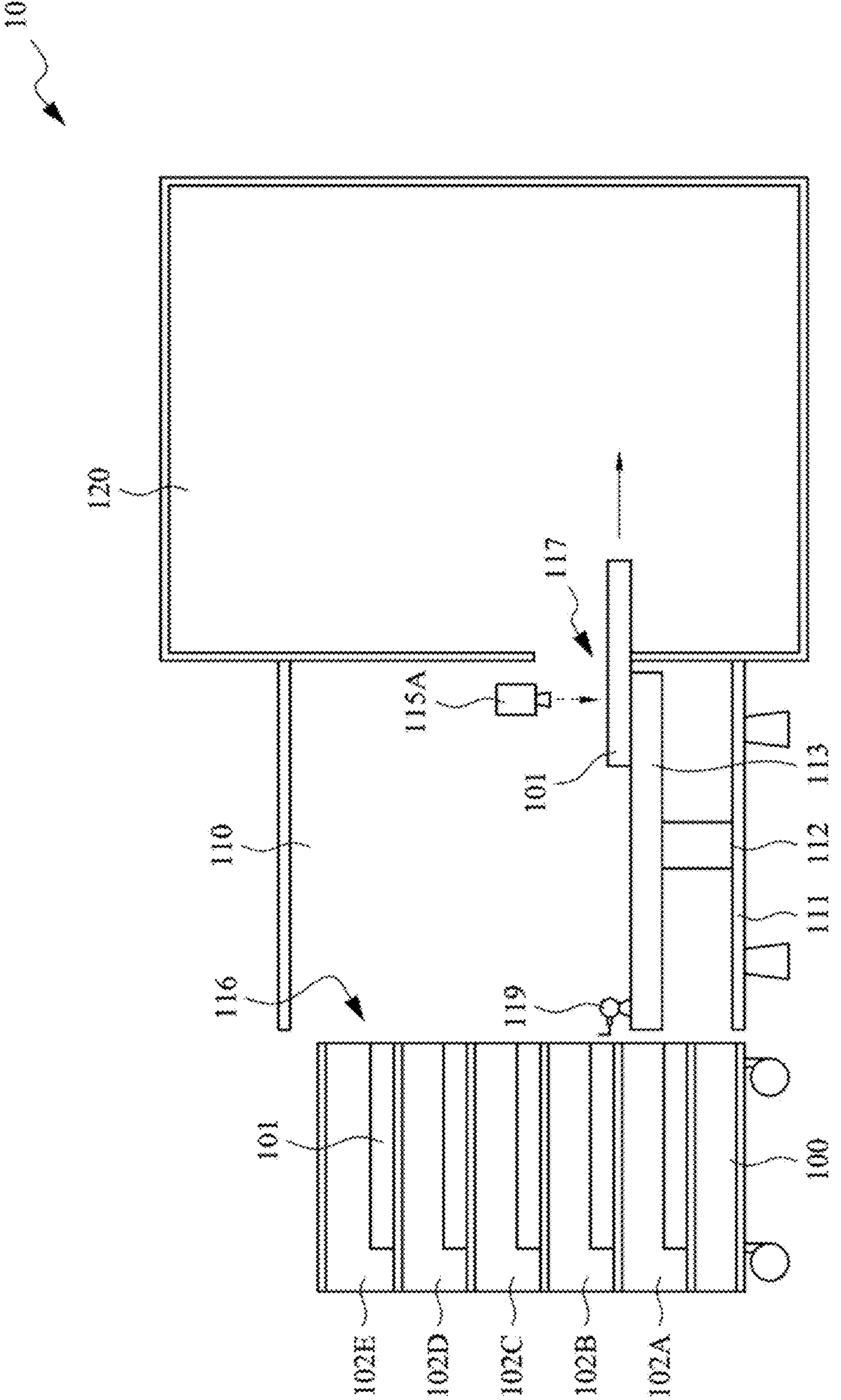
FIG. 3A is schematic cross-sectional view of a testing system where a testing board enters an IC test chamber in accordance with some embodiments of the present disclosure.
Figure 3B:
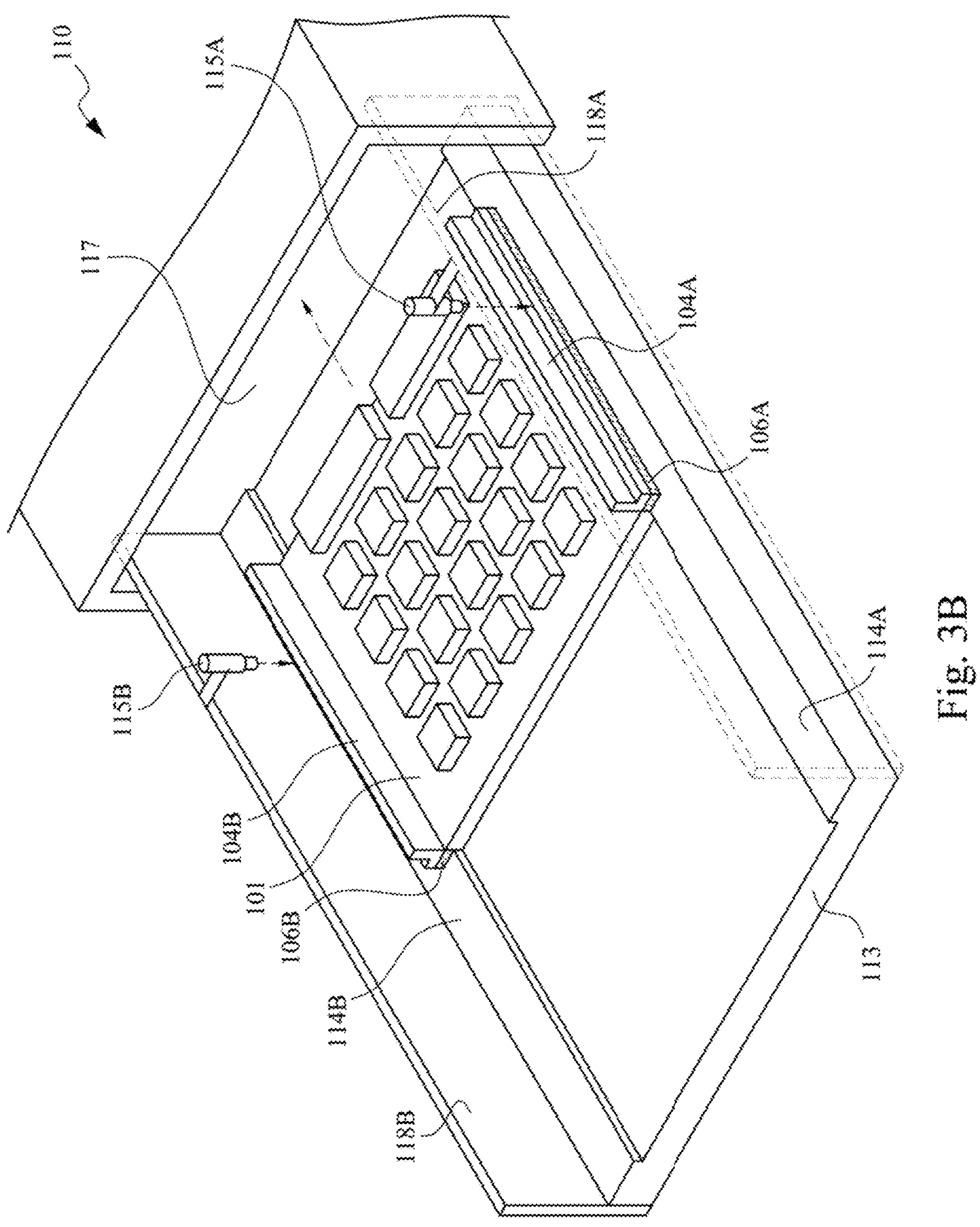
FIG. 3B is a schematic view of a testing board entering an IC test chamber in accordance with some embodiments of the present disclosure.
Figure 4A:
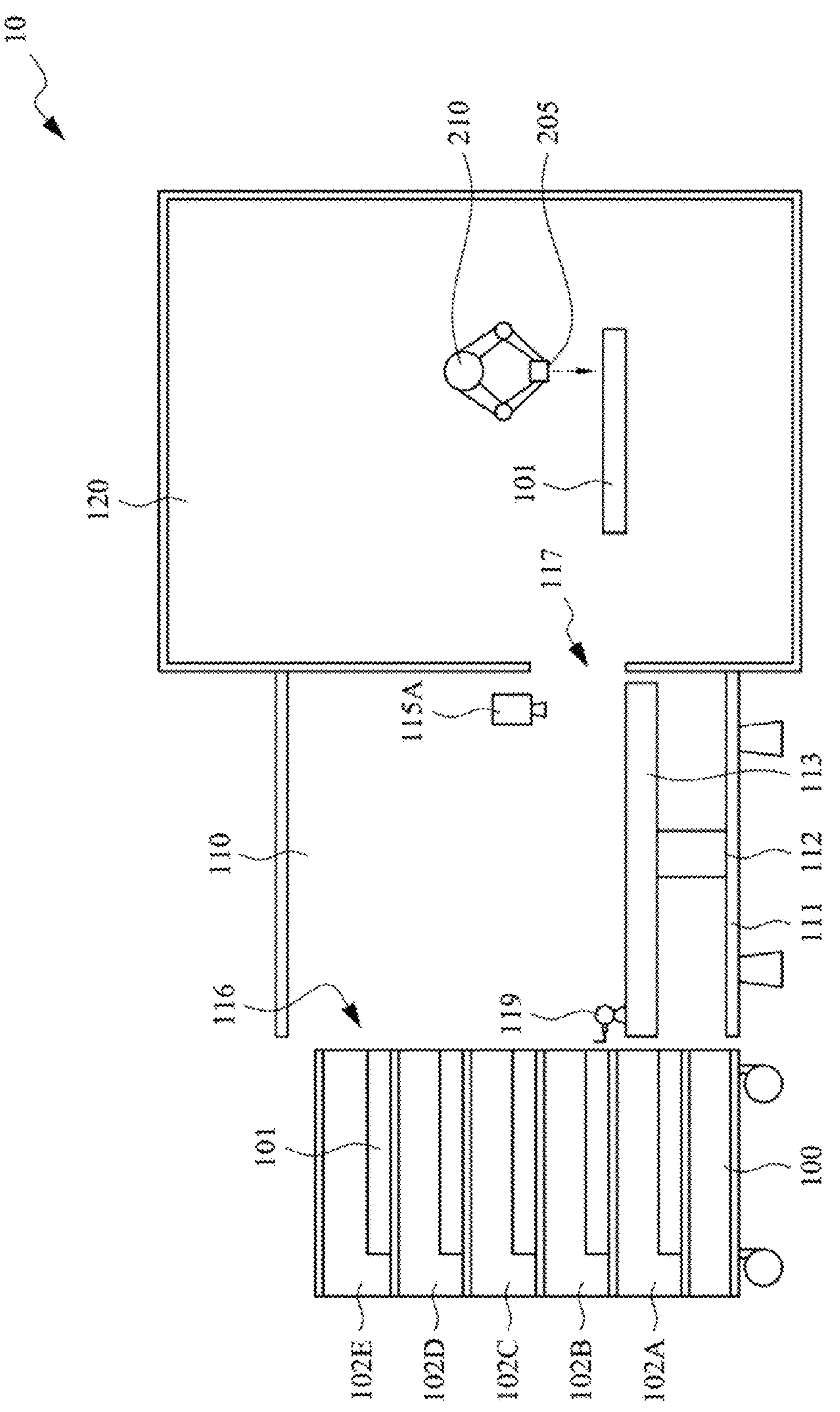
FIG. 4A is schematic cross-sectional view of a testing system where ICs are mounted on a testing board in accordance with some embodiments of the present disclosure.
Figure 4B:
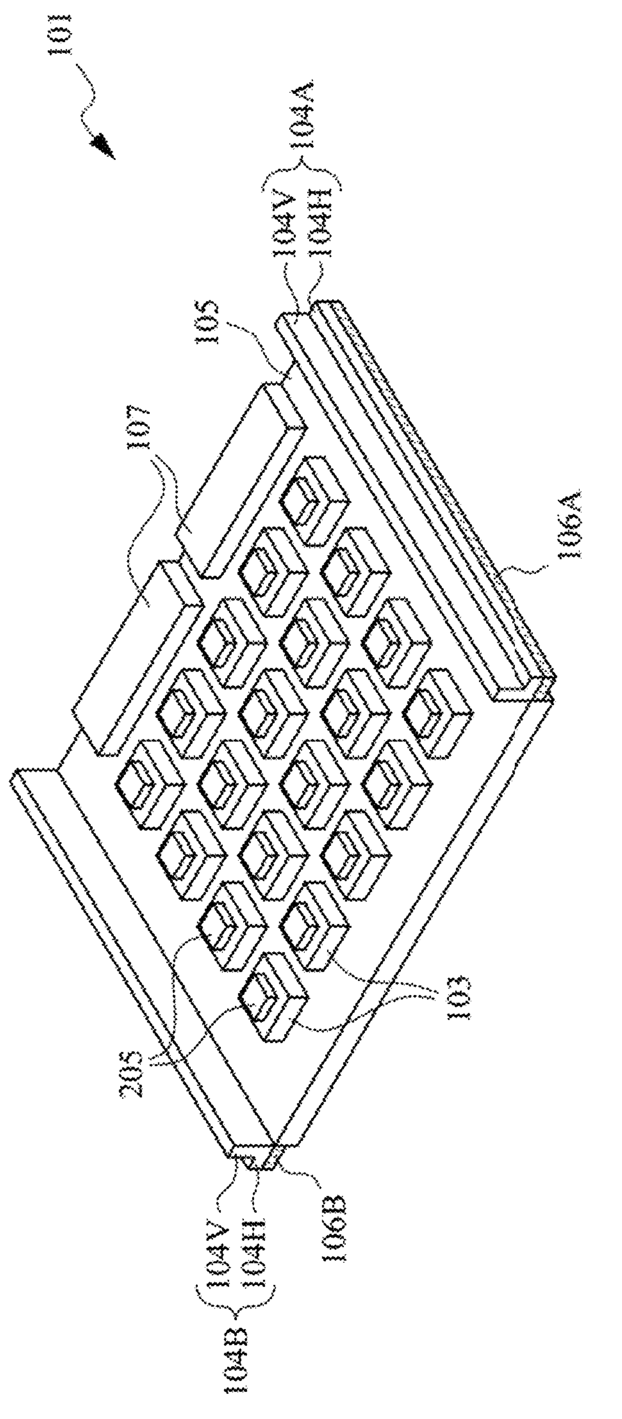
FIG. 4B is a schematic view of a testing board mounted with ICs in an IC test chamber in accordance with some embodiments of the present disclosure.

FIG. 2 is a flow chart of methods of testing ICs in accordance with some embodiments of the present disclosure. FIG. 3A is schematic cross-sectional view of a testing system where a testing board enters an IC test chamber in accordance with some embodiments of the present disclosure. FIG. 3B is a schematic view of a testing board entering an IC test chamber in accordance with some embodiments of the present disclosure. FIG. 4A is schematic cross-sectional view of a testing system where ICs are mounted on a testing board in accordance with some embodiments of the present disclosure. FIG. 4B is a schematic view of a testing board mounted with ICs in an IC test chamber in accordance with some embodiments of the present disclosure.

The testing method M10 of FIG. 2 can be applied by the testing system 10 with reference to FIGS. 1A to 1D, and the testing method M10 will be discussed in conjunction with FIGS. 1A to 1D, 3A, 3B, 4A and 4B. As illustrated in FIG. 2, a testing method M10 may include the following operations S100, S200, S300, S301, S302, S303, S400, S500, and S600.

The method M10 starts from operation S100 by placing a testing board on a board conveying device. In some embodiments, the testing boards 101 can be placed on different layers (e.g., layers 102A to 102E) of the board conveying device 100 through manpower. That is, the testing boards 101 can be manually placed on the board conveying device 100.

The method M10 proceeds to operation S200 by moving the testing board to a board transfer chamber. Specifically, the testing board 101 is moved from the board conveying device 100 to a storage platform 113 in the board transfer chamber 110. For example, the lifting device 112 may move the storage platform 113 along the vertical direction to reach a target layer (e.g., one of the layers 102A to 102E). Then, the testing board 101 at the target layer can be dragged by a robot arm 119 or other suitable devices along the horizontal direction from the board conveying device 100 to the storage platform 113 in the board transfer chamber 110. Once the testing board 101 is moved onto the storage platform 113, the lifting device 112 can move the storage platform 113 again to move the testing board 101 to a position near the interface 117 between the board transfer chamber 110 and the IC test chamber 120.

The method M10 proceeds to operation S300 by moving the testing board to the IC test chamber. Specifically, the testing board 101 is moved from the board transfer chamber 110 to an IC test chamber 120. In some embodiments, the testing board 101 can be moved into the IC test chamber 120 by the robot arm 119 or other robot arms (not shown) built near the storage platform 113.

The method M10 proceeds to operation S301 by determining whether a flatness of the testing board is acceptable. Specifically, the flatness of the testing board 101 is determined during moving the testing board to the IC test chamber. As shown in FIGS. 3A and 3B, during the movement of the testing board 101, the testing board 101 may pass through a position that is vertically below the first and second sensors 115A and 115B. As the testing board 101 passes through the first sensor 115A and the second sensor 115B, the results from the first sensor 115A and second sensor 115B are transmitted to a processor (e.g., processor 300 in FIG. 5) and the flatness of the testing board 101 can be calculated based on the sensing results.

For example, the levels of the opposite ends of the testing board 101 can be sensed by the first and second sensors 115A and 115B as discussed above. In detail, the first sensor 115A can sense a first level at one end of the testing board 101, and the second sensor 115B can sense a second level at the other end of the testing board 101. By comparing the difference between the first level and the second level, the flatness of the testing board 101 can be determined.

When the difference between the first level and the second level falls within a pre-determined specification, the testing board 101 is determined to have an acceptable flatness, thus normal. On the other hand, when the difference between the first level and the second level is beyond the pre-determined specification, the testing board 101 is determined to have an unacceptable flatness, thus abnormal. In some embodiments, if the difference between the first level and the second level is larger than about 2 mm, the flatness of the testing board 101 is determined as unacceptable. In other embodiments, the pre-determined specification can also be about 1 mm to about 3 mm.

In other embodiments, the flatness of the testing board 101 is determined as acceptable when a first difference between the first level and a reference level and a second difference between the second level and the reference level are all within a pre-determined specification. On the other hand, the flatness of the testing board 101 is determined as unacceptable when any of the first difference or the second difference is beyond the pre-determined specification.

If the flatness of the testing board 101 is determined as acceptable, the method M10 proceeds to operation S400 by placing a testing device on the testing board. As shown in FIG. 4A, after the testing board 101 is moved into the IC test chamber 120, ICs 205 are placed on sockets 103 of testing board 101 through a pick-and-place mechanism 210. In some embodiments, the pick-and-place mechanism 210 may include a robot arm. FIG. 4B illustrates an example where ICs 205 are placed on the sockets 103 of the testing board 101.

The method M10 proceeds to operation S500 by testing the testing device on the testing board. After the testing device has been placed on the testing board, the testing device is tested. In some embodiments, the ICs 205 on the testing board 101 are tested to detect any early failures due to defects in design, materials, process, or manufacturing.

In some embodiments, testing the ICs 205 on the testing board 101 includes a pre-test and a main test. The pre-test is performed to test whether the electric connections between a control unit (such as a computer) and each of the testing board 101 are well connected, and to test whether the internal circuits well connect the ICs 205 on the testing board 101. When the electric connections and the internal circuits are well connected, the control unit determines the testing board 101 passing the pre-test and performs the main test afterwards.

The main test is an aging test configured to detect early failures of the ICs 205 under stress. In the main test, the control unit is configured to transmit a test signals to the testing board 101. The control unit is further configured to control a temperature in the IC test chamber 120. The ICs 205 are tested at different temperatures such as about 35, 90, 129, and −10° C. The control unit is configured to receive the test signals from the testing board 101 and determine a status of each of the ICs 205. The status includes a pass status or a failed status. The status of each of the ICs 205 indicates whether the corresponded IC passes the main test.

Finally, the method M10 proceeds to operation S600 by removing the testing device from the testing board. Specifically, ICs 205 are removed from the testing board 101 when the test finishes.

Referring back to operation S301, on the other side, if the flatness of the testing board is determined as unacceptable, the method M10 proceeds to S302 by halting the movement of the testing board. Specifically, after determining the flatness of the testing board as unacceptable, the testing system 10 transmits signals to the processor (e.g., processor 300 in FIG. 5) to halt the abnormal testing board 101 from entering the IC test chamber 120.

Figure 5:
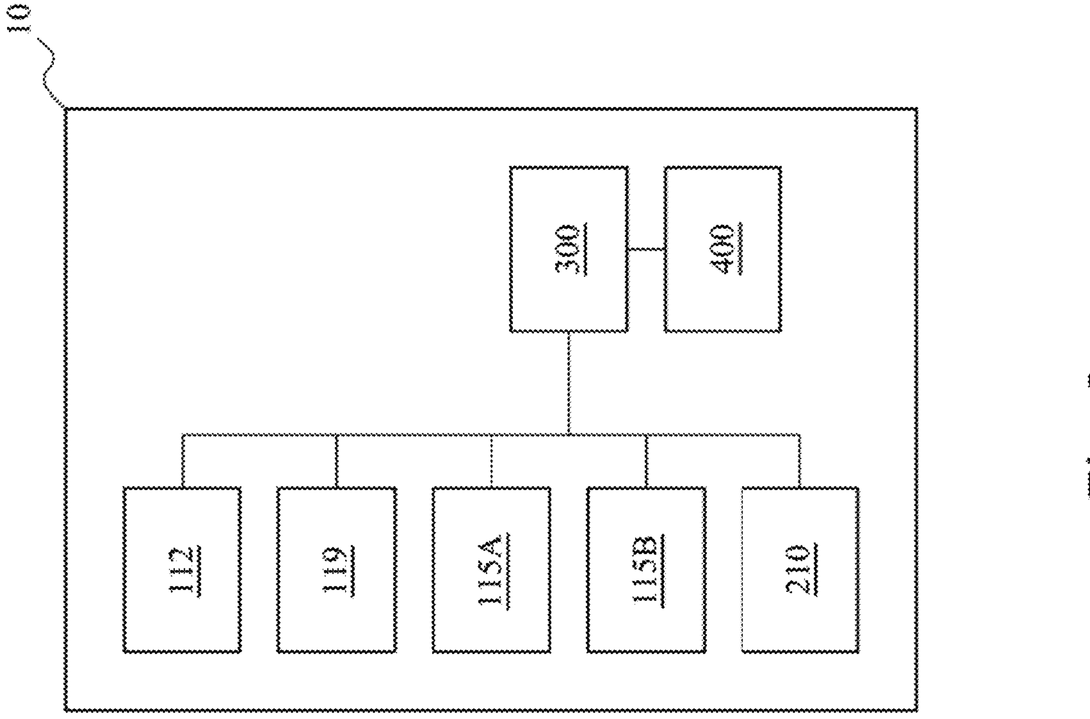
FIG. 5 is a block diagram of a testing system in accordance with some embodiments of the present disclosure.

In some embodiments, if the flatness of the testing board is determined as unacceptable, the processor stops the movement of the testing board 101 to prevent it from entering the IC test chamber 120, and displays an abnormality warning signal on a display device (e.g., display device 400 in FIG. 5).

Finally, the method M10 proceeds to S303 by removing the testing board from the testing system. In some embodiments, the testing board 101 can be removed from the testing system 10 through manpower for troubleshooting. After troubleshooting is completed, the testing board 101 may be placed back into the testing system 10 in operation S100.

The unacceptable flatness of the testing board 101 may be caused by the defective edges of the testing board 101. The unacceptable flatness of the testing board 101 may lead to the skewing of its feedstock such as ICs 205 in the subsequent processes such as mounting, loading and unloading, which may further cause other issues such as pre-test contact, over kill condition during the basic open/short verification process, or damage on device. The present disclosure provides a system and a method for monitoring the flatness of the testing boards 101 to avoid abnormal testing boards 101 entering the IC test chamber 120. Accordingly, the above issues can be addressed.

FIG. 5 is a block diagram of a testing system in accordance with some embodiments of the present disclosure. The testing system 10 further includes a processor 300 electrically coupled with the lifting device 112, the robot arm 119, the first sensor 115A, the second sensor 115B, and the pick-and-place mechanism 210. The processor 300 may be configured to conduct the operations of the lifting device 112, the robot arm 119, the first sensor 115A, the second sensor 115B, and the pick-and-place mechanism 210 as discussed above. In some embodiments, the processor 300 may also be configured to perform the operations S200, S300, S301, S302, S400, and S500 of the testing method M10 in FIG. 2. In some embodiments, the processor 300 can be a computer system which includes a central processing unit (CPU), a memory, circuits for the CPU, or In and Out (I/O) device.

The testing system 10 further includes a display device 400 connecting with the processor 300. In some embodiments, the display device 400 can be used to display the abnormality warning signal when the flatness of the test board is determined as unacceptable as discussed above. In some embodiments, the display device 400 may include a monitor, a computer screen, or the like.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A testing system, comprising:

a board conveying device for holding a testing board;

a board transfer chamber connecting with the board conveying device, wherein the board transfer chamber comprises a first sensor and a second sensor configured to detect a flatness of the testing board, wherein the first sensor is configured to detect a first level of one end of the testing board and the second sensor is configured to detect a second level of another end of the testing board;

a processor configured to determine the flatness of the testing board by calculating a difference between the first level and the second level; and an IC test chamber connecting with the board transfer chamber.

2. The testing system of claim 1, wherein the first sensor is configured to generate a radiation downward to the testing board.

3. The testing system of claim 1, wherein the first sensor is an infrared sensor.

4. The testing system of claim 1, wherein the board conveying device comprises a plurality of layers, and the board transfer chamber comprises a storage platform configured to support the testing board, and a lifting device configured to move the storage platform along the plurality of layers of the board conveying device.

5. The testing system of claim 4, wherein the board transfer chamber has a wall along one side of the storage platform, and the first sensor is fixed on the wall.

6. The testing system of claim 1, wherein the IC test chamber comprises a pick-and-place mechanism configured to place a testing device on the testing board.

7. The testing system of claim 1, wherein the board transfer chamber comprises a robot arm configured to drag the testing board from the board conveying device to the board transfer chamber.

8. A method of a testing system, comprising:

moving a testing board from a board conveying device to a board transfer chamber;

moving the testing board from the board transfer chamber to an IC test chamber;

determining whether a flatness of the testing board is acceptable during moving the testing board, comprising:

sensing a first level of one end of the testing board and sensing a second level of another end of the testing board during moving the testing board;

calculating a difference between the first level and the second level; and determining whether the difference falls within a predetermined specification; and placing a testing device on the testing board when the flatness of the testing board is determined as acceptable.

9. The method of claim 8, wherein sensing the first level of the one end of the testing board and sensing the second level of the another end of the testing board further comprises:

emitting radiations, from a first sensor and a second sensor, toward the one end and the another end of the testing board, respectively; and receiving, by the first sensor and the second sensor, the radiations reflected by the testing board.

10. The method of claim 9, wherein the radiations are emitted downward toward the testing board.

11. The method of claim 9, wherein the radiations are infrared radiations.

12. The method of claim 9, wherein the radiations are emitted toward a first support frame and a second support frame of the testing board, respectively.

13. The method of claim 12, wherein the first and second support frames include substantially flat surfaces.

14. The method of claim 8, wherein determining whether the flatness of the testing board is acceptable during moving the testing board comprises:

calculating a first difference between the first level and a reference level and a second difference between the second level and the reference level; and determining whether the first and second differences both fall within the pre-determined specification.

15. The method of claim 8, further comprising halting moving the testing board when the flatness of the testing board is determined as unacceptable.

16. The method of claim 8, further comprising displaying an abnormality warning signal when the flatness of the testing board is determined as unacceptable.

* * * * *